United States Patent [19]
Kim

[11] Patent Number: 6,040,582
[45] Date of Patent: Mar. 21, 2000

[54] ION BEAM FOCUSER FOR AN ION IMPLANTER ANALYZER

[75] Inventor: Han-sung Kim, Kyungki-do, Rep. of Korea

[73] Assignee: Samsung Electronics Co., Ltd., Rep. of Korea

[21] Appl. No.: 09/022,794

[22] Filed: Feb. 13, 1998

[30] Foreign Application Priority Data

May 13, 1997 [KR] Rep. of Korea ...................... 97-18575

[51] Int. Cl.[7] .................................................. H01J 37/30
[52] U.S. Cl. ................. 250/492.21; 250/398; 250/423 R
[58] Field of Search .............................. 250/492.21, 398, 250/281, 423 R

[56] References Cited

U.S. PATENT DOCUMENTS

| | | | |
|---|---|---|---|
| 3,585,397 | 6/1971 | Brewer | 250/492.21 |
| 4,804,852 | 2/1989 | Rose et al. | 250/492.21 |
| 4,914,305 | 4/1990 | Benveniste et al. | 250/492.21 |
| 5,132,545 | 7/1992 | Shono et al. | 250/492.21 |
| 5,350,924 | 9/1994 | Stengl et al. | 250/398 |
| 5,572,022 | 11/1996 | Schwartz et al. | 250/282 |
| 5,850,084 | 12/1998 | Holkeboer | 250/423 R |

*Primary Examiner*—Bruce C. Anderson
*Attorney, Agent, or Firm*—Myers Bigel Sibley & Sajovec, P.A.

[57] ABSTRACT

A focusing guide for focusing an ion beam passing through the chamber of an ion analyzer is provided. A controllable electric of magnetic field is generated around the focusing guide to direct selected ions through the chamber outlet without significantly reducing ion beam current intensity. The focused ion beam reduces collisions of ions with the chamber and also reduces secondary electron generation which can weaken ion beam intensity and increase ion implantation processing time.

9 Claims, 2 Drawing Sheets

ION BEAM FOCUSER FOR AN ION IMPLANTER ANALYZER

FIELD OF THE INVENTION

The present invention relates generally to ion implanters used for fabricating semiconductor devices, and more particularly to analyzers for ion implanters.

BACKGROUND OF THE INVENTION

Ion implantation is a process used in the manufacture of semiconductor devices. Typically, ionized dopants, such as $A_xH_3$ (arsine) and $PH_3$ (phosphine), are implanted into the surface of a masked wafer by accelerating them at high speed. Once an ion is implanted, it can be diffused to desired regions of the semiconductor device. A typical ion implanter includes an ion source for producing ions, a beam line, and an end station. The beam line may include an analyzer for selecting specific ions, based upon their mass, from the ions generated by the ion source.

As illustrated in FIG. 1, a mass spectrometer may be used as an ion analyzer 18 to select specific ions. Supplied gas is turned to a plasma-state by the high-frequency voltage applied from the power source 12 in the ion source 10. Positive ions activated by the high frequency voltage are extracted, thus forming an ion beam 24. The ion beam 24 is focused via electric fields generated by voltage applied to a plurality of suppression electrodes 14 and ground electrodes 16 as illustrated.

The ion analyzer 18 selects the specific ions to be injected from the ion beam 24 by adjusting the electric field formed inside the ion analyzer chamber 19. The ion beam 24 is induced into the ion analyzer chamber 19 and ions within the ion beam are deflected at different angles within the ion analyzer chamber according to their mass. Most of the unwanted ions collide with the inner wall 50 of the ion analyzer chamber 19 and are extinguished. However, positive ions having the desired mass proceed through the ion analyzer chamber 19.

The positive ions induced into the inlet 20 of the ion analyzer chamber 19 are deflected by the electric field inside the chamber. The deflected angle of each positive ion in the ion beam is different according to each ion's intrinsic mass. The positive ions having a large mass have a small deflected angle, and the positive ions having a small mass have a large deflected angle. The positive ions which have deflected angles that are too large or too small collide with the inner wall 50 of the ion analyzer chamber 19, and are thereby extinguished. By contrast, the ions having the desired mass for injection pass through the ion analyzer chamber 19 and are extracted from the ion analyzer chamber at an outlet 22 located at the end of the ion analyzer chamber.

The ion beam of positive ions induced into the inlet 20 of the ion analyzer chamber 19 has a certain angle of dispersion. The ion beam of positive ions becomes more widely dispersed as it proceeds inside the chamber. Therefore, many of the positive ions collide with the inner wall 50 of the ion analyzer chamber 19. Unfortunately, a considerable number of ions having the desired mass are lost by the collisions caused by the ion beam dispersion angle. As a result, the current of the ion beam passing through the ion analyzer chamber may be weakened.

Another problem caused by the dispersion angle of the ion beam induced into the ion analyzer chamber 19 is that secondary electrons are generated as a result of these ion collisions. These secondary electrons have a polarity opposite to that of the positive ions within the ion beam. Accordingly, the secondary ions proceed in a direction opposite to the ion beam direction and interfere with the ion beam, further decreasing the current intensity of the ion beam.

The acceleration energy of an ion in ion implantation affects the depth of the ion when injected. The current intensity of an ion beam affects ion implantation processing time. Therefore, a reduction in ion beam current intensity because of collisions inside the inner wall 50 of the ion analyzer chamber 19, and because of secondary electrons generated thereby, may cause processing time delay during ion implantation.

SUMMARY OF THE INVENTION

In view of the foregoing, it is an object of the present invention to provide an ion implanter for improving the pass rate of selected ions within an ion beam induced into an ion analyzer chamber by reducing ion collisions with the walls of the chamber.

It is another object of the present invention to reduce the generation of secondary electrons within an ion analyzer chamber.

These and other objects of the present invention are provided by an ion analyzer having a chamber with an inlet and an outlet at respective ends thereof, and a focusing guide for focusing an ion beam passing through the chamber such that collisions of ions with the chamber between the inlet and outlet are reduced. A mass spectrometer may serve as means for selecting particular ions within the ion beam based upon ion mass. A controllable electric or magnetic field is generated around the focusing guide to direct the selected ions through the chamber outlet without significantly reducing ion beam current intensity. The focusing guide also reduces secondary electron generation which can weaken ion beam intensity and increase ion implantation processing time.

According to one aspect of the present invention, the focusing guide is secured within the ion analyzer chamber inlet and has an aperture formed therein. The aperture preferably has an axial direction that is aligned with the axial direction of the chamber inlet. The axial direction of the aperture may be parallel with the axial direction of the chamber inlet, or may be somewhat offset therefrom. A power supply provides electrical power to the focusing guide via one or more electrical conductors. Electrical power serves as means for forming an electric field around the focusing guide to focus an ion beam passing through the aperture. The strength of the electric field is controlled by varying the voltage of electrical power supplied from the power supply. The magnitude of the electric voltage for controlling the electric field strength may be in a range from between 0 and 10,000 Volts.

According to another aspect of the present invention, an ion beam is focused by varying a magnetic field around the aperture of the focusing guide.

The present invention is advantageous because the number of ions extinguished by collisions with the inner wall of the ion analyzer chamber and the adverse current of secondary electrons is reduced. Accordingly, weakening of the ion beam intensity is correspondingly reduced.

BRIEF DESCRIPTION OF THE DRAWINGS

The accompanying drawings, which are incorporated in and constitute a part of the specification, illustrate an embodiment of the invention and, together with the description, serve to explain the principles of the invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
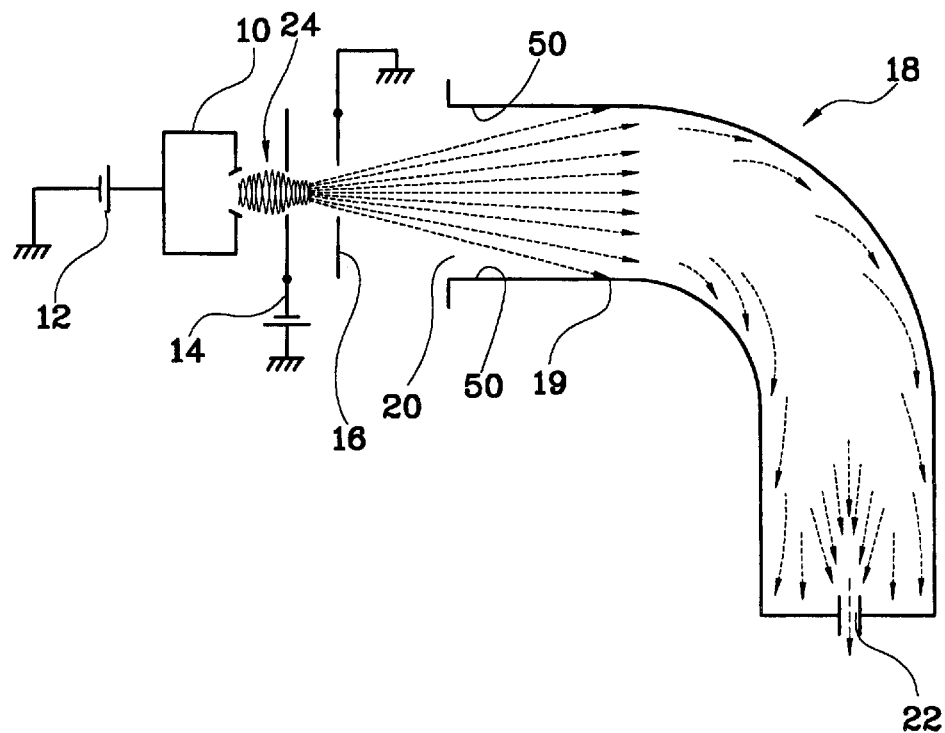
FIG. 1 is a schematic representation of a conventional ion implanter having an analyzer chamber.
Figure 2:
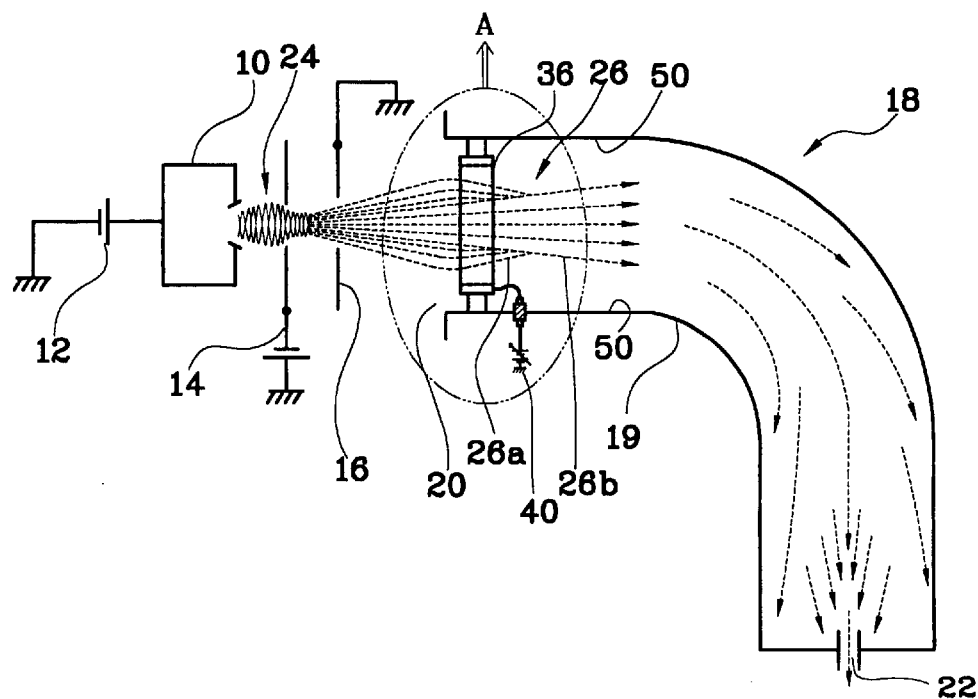
FIG. 2 illustrates the ion analyzer chamber having a focusing guide installed therein, according to an embodiment of the present invention.

Referring now to FIG. 2, a focusing guide 36 is installed in the ion analyzer chamber inlet 20. The focusing guide 36 focuses the ion beam 24 induced into the ion analyzer chamber 19 and thereby reduces the number of collisions of positive ions with the inner wall 50. Because the number of positive ion collisions is reduced, the generation of secondary electrons is also reduced.

The focusing guide 36 generates an electric field or magnetic field having strength sufficient to focus the incoming ion beam 24. The electric field is preferably formed by applying a voltage to the focusing guide 36 via a power supply 40. The applied voltage is preferably variable so that the intensity of the electric field is correspondingly variable. By controlling the electric field (or magnetic field), the focusing state of the ion beam is controllable. Similarly, when a magnetic field is generated by the focusing guide 36, the focusing state of the ion beam is controlled by controlling the magnetic field.

The embodiment illustrated in FIG. 2 shows the focusing state of the induced ion beam 24 being controlled by an electric field. The ion beam 24 induced into the ion analyzer 18 from the ion generator 10 is focused in the inlet 20 by the focusing guide 36 installed therein. The focused ion beam 26, exiting from the focusing guide 36, proceeds toward the ion analyzer chamber outlet 22, as illustrated. The ion beam 26 exiting from the focusing guide 36 has less dispersion than the ion beam entering the ion analyzer chamber inlet 20. This is illustrated in FIG. 2 wherein the ion beam 26 exiting from the focusing guide 36 has a smaller cross-section than that of the ion beam entering the ion analyzer chamber inlet 20.

Figure 3:
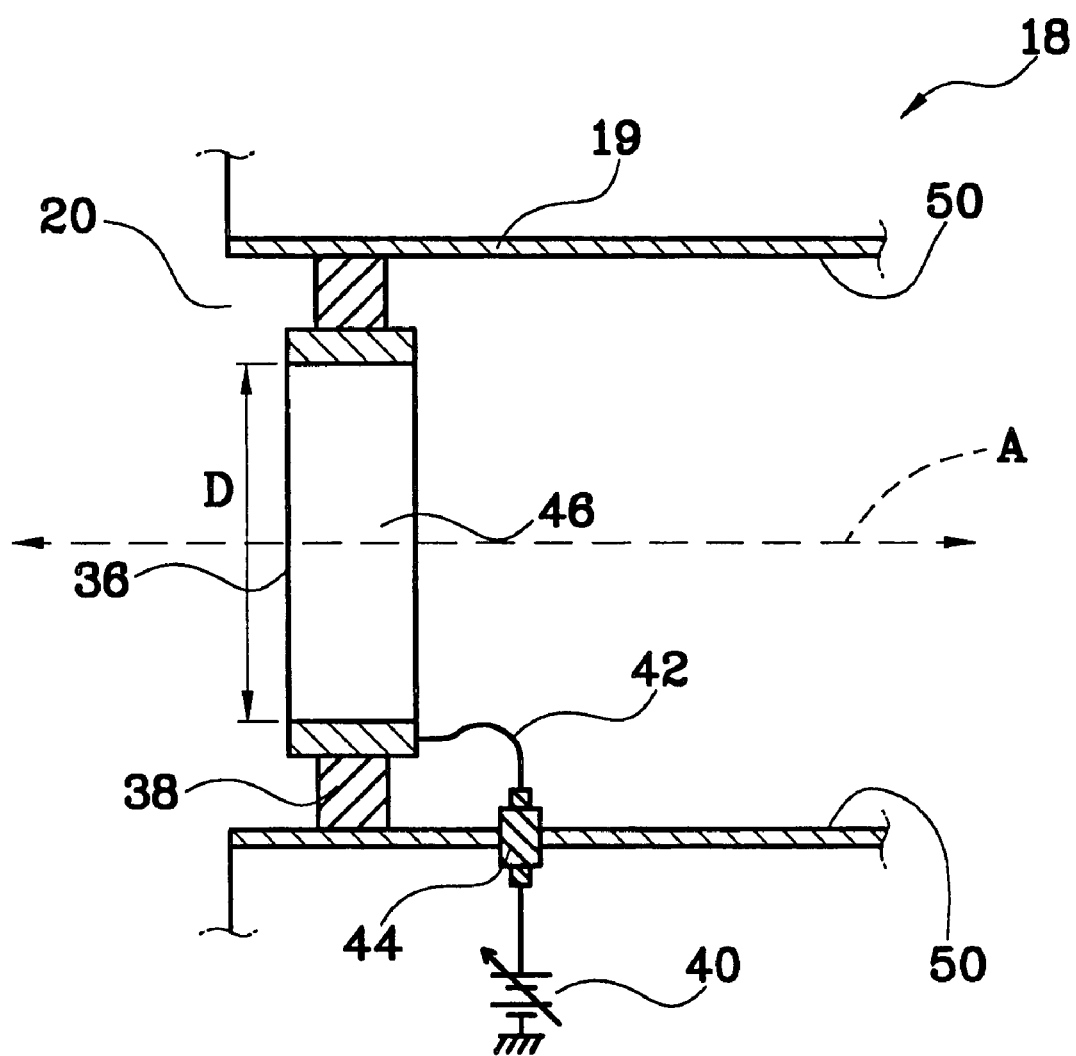
FIG. 3 is an enlarged cross-sectional view of the focusing guide illustrated in FIG. 2.

Referring now to FIG. 3, the focusing guide 36 will be described in detail. The focusing guide 36 preferably is formed from the same conductive material as the ion analyzer chamber 19. A particularly preferred material is aluminum. The focusing guide 36 has an aperture 46 formed therethrough as illustrated. The aperture 46 has an axial direction A substantially parallel with the axial direction of the ion analyzer chamber inlet 20. The aperture 46 has a diameter D of sufficient size to permit the induced ion beam to pass therethrough.

The focusing guide 36 is secured to the inner wall 50 of the ion analyzer chamber 19 with an insulator 38 secured therebetween, as illustrated. Voltage is provided by the power supply 40 via electrical conductor 42. The electrical conductor 42 penetrates the inner wall 50 of the ion analyzer chamber 19 through a "Feed-Thru" device 44 inserted through the inner wall 50 of the ion analyzer chamber. As is known to those skilled in the art, the Feed-Thru device 44 includes seals therewithin which allow the electrical conductor 42 to penetrate the inner wall 50 of the ion analyzer chamber 19 without destroying the high vacuum inside the ion analyzer chamber. The Feed-Thru device 44 also provides electrical insulation between the electrical conductor 42 and the ion analyzer chamber inner wall 50. It is understood that other insulating and sealing devices may be utilized to allow the electrical conductor 42 to pass through the ion analyzer chamber inner wall 50 without departing from the spirit and intent of the present invention. Preferably, a negative voltage having a magnitude between about 0 Volts and 10,000 Volts is supplied to the focusing guide 36 via the electrical conductor 42.

Referring back to FIG. 2, supply gas is ionized by the high frequency voltage in the ion source 10 and positive ions are extracted by the high frequency voltage into an ion beam 24. The types of positive ions extracted from the supply gas via the ion source 10 are varied and may include ions such as $11B^+$, $75As^+$, $31PH^+$, $F^+$, and the like. Each type of positive ion extracted has a respective intrinsic mass. The ion analyzer can select one or more of these positive ions for injection, such as $11B^+$ or $F^+$, based on their mass. Typically, a mass spectrometer or similar device is utilized for this purpose.

The induced ion beam 24 passes through the ion analyzer chamber inlet 20, and is focused by the electric field (or magnetic field) generated by the voltage applied to the focusing guide 36 as the ion beam passes through the focusing guide aperture 46. The focused ion beam 26 exiting from the focusing guide 36 is dispersed as it proceeds into the ion analyzer chamber, as illustrated in FIG. 2, but to a lesser degree than the unfocused ion beam entering the ion analyzer chamber inlet 20.

The voltage applied to the guide 36 by the power supply 40 causes an electric field to form around the focusing guide. The voltage applied may vary from about 0 Volts to 10,000 Volts to permit control over the strength of the electric field. Accordingly, the focusing state of the ion beam can be varied by varying the strength of the electric field formed around the focusing guide 36.

The electric field formed around the focusing guide 36 causes light ions 26a to deflect towards the axis of the ion analyzer chamber inlet and heavy ions 26b to deflect away from the axis of the ion analyzer chamber inlet, as illustrated in FIG. 2. The heavy or light ions among the exiting ion beam 26 collide with the inner wall 50 of the ion analyzer chamber. However, the ions having the desired mass for injection proceed through the ion analyzer chamber having a deflected angle that reduces the chance of collision with the inner wall 50. These ions exit the ion analyzer chamber via outlet 22. In other words, the ions for injection pass through the ion analyzer chamber 19, are accelerated thereby and are injected into a wafer at the end station adjacent ion analyzer chamber outlet 22. However, because the induced ion beam 24 is focused by the focusing guide 36, the exiting ion beam 26 is only slightly dispersed and the number of the ions colliding with the inner wall 50 of the ion analyzer chamber 19 is decreased.

Because the number of collisions is reduced, the number of secondary electrons generated is also reduced.

Furthermore, the polarity of the voltage applied to the focusing guide 36 is preferably selected to repel secondary electrons and thereby further limit the flow of secondary electrons within the ion analyzer chamber 19.

When a magnetic focusing guide is utilized, the ion beam is focused by the magnetic field according to the same principle illustrated in FIG. 2 and described above. Furthermore, secondary electrons generated by the collision of the ion beam are constrained by the magnetic field.

According to the present invention, a dispersed ion beam 24 induced into the ion analyzer chamber inlet 20, is focused by a focusing guide 36 such that positive ions are redispersed and deflected in the focusing guide based upon their respective masses. Ions having a desired mass are extracted from the ion analyzer chamber via the outlet 22. Because ion collisions are reduced, the number of generated secondary electrons is correspondingly reduced. Furthermore, the generation of secondary electrons is constrained by the electric field (or magnetic field) applied to the focusing guide. Accordingly, weakening of current intensity of an ion beam induced from the ion source is reduced.

The foregoing is illustrative of the present invention and is not to be construed as limiting thereof. Although a few exemplary embodiments of this invention have been described, those skilled in the art will readily appreciated that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. An ion analyzer for an ion implanter used for implanting ions on a semiconductor wafer surface, said ion analyzer comprising:

a curved ion analyzer chamber having an inlet and an outlet at respective ends thereof;

a focusing guide secured within, and electrically insulated from, said curved ion analyzer chamber inlet, said focusing guide having an aperture formed therein, wherein said focusing guide is configured to focus an ion beam passing through said curved ion analyzer chamber such that said ion beam exiting said focusing guide has less dispersion than said ion beam entering said curved ion analyzer chamber inlet, and wherein collisions of ions with said curved ion analyzer chamber between said inlet and outlet are reduced; and means for forming one of an electric field and a magnetic field around said focusing guide to focus said ion beam passing through said aperture.

2. An ion analyzer according to claim 1 further comprising means for selecting ions from said ion beam having a desired mass.

3. An ion analyzer according to claim 2 wherein said means for selecting an ion from said ion beam comprises a mass spectrometer.

4. An ion analyzer according to claim 1 wherein said means for forming an electric field around said focusing guide comprises:

a power supply; and means for supplying electrical power from said power supply to said focusing guide.

5. An ion analyzer according to claim 4 wherein said means for supplying electrical power comprises means for supplying variable voltage electrical power.

6. An ion analyzer according to claim 4 wherein said power supply can supply electrical power having a voltage of between 0 volts and 10,000 volts.

7. An ion analyzer according to claim 1 further comprising means for varying a magnetic field formed around said focusing guide.

8. An ion analyzer for an ion implanter used for implanting ions on a semiconductor wafer surface, said ion analyzer comprising:

a curved ion analyzer chamber having an inlet and an outlet at respective ends thereof;

a focusing guide secured within, and electrically insulated from, said curved ion analyzer chamber, said focusing guide having an aperture formed therein with an axial direction aligned with an axial direction of said chamber inlet, wherein said focusing guide is configured to focus an ion beam passing through said curved ion analyzer chamber such that said ion beam exiting therefrom has less dispersion than said ion beam entering said curved ion analyzer chamber inlet;

a power supply;

means for supplying electrical power from said power supply to said focusing guide to form an electric field around said focusing guide for focusing said ion beam passing through said aperture; and a mass spectrometer for selecting ions from said ion beam having a desired mass.

9. An ion analyzer according to claim 8 further comprising means for varying voltage of said electrical power supplied from said power supply to said focusing guide.

* * * * *